US010236668B2

United States Patent
Stahl, II et al.

(10) Patent No.: US 10,236,668 B2
(45) Date of Patent: Mar. 19, 2019

(54) MOLDED BOX COVER FOR FIRE AND ACOUSTICAL SEALING OF ELECTRICAL BOXES

(71) Applicant: Specified Technologies Inc., Somerville, NJ (US)

(72) Inventors: James P. Stahl, II, Princeton, NJ (US); Gabe DiMarino, Chalfont, PA (US); Paul Gandolfo, Doylestown, PA (US)

(73) Assignee: Specified Technologies, Inc., Somerville, NJ (US)

( * ) Notice: Subject to any disclaimer, the term of this patent is extended or adjusted under 35 U.S.C. 154(b) by 0 days.

(21) Appl. No.: 15/601,093

(22) Filed: May 22, 2017

(65) Prior Publication Data
US 2017/0338635 A1 Nov. 23, 2017

Related U.S. Application Data

(60) Provisional application No. 62/339,209, filed on May 20, 2016.

(51) Int. Cl.
*H02G 3/08* (2006.01)
*H05K 3/38* (2006.01)
(Continued)

(52) U.S. Cl.
CPC ........... *H02G 3/088* (2013.01); *H02G 3/0412* (2013.01); *H05K 3/38* (2013.01); *H02G 3/123* (2013.01)

(58) Field of Classification Search
CPC ............ H02G 3/088; H02G 3/14; H02G 3/12; H02G 3/08; H02G 3/0412; H02G 3/123; H05K 3/38
See application file for complete search history.

(56) References Cited

U.S. PATENT DOCUMENTS 2,867,349 A    1/1959   Parker, Jr.
2,997,520 A    8/1961   Kinsman
(Continued)

FOREIGN PATENT DOCUMENTS

CA        1101978 A     5/1981

OTHER PUBLICATIONS

Seal for Soundproofing Electrical & LightSwitch Outlet Boxes, Compatible with all Manufactures—Trademark Soundproofing— http://www.tmsoundproofing.com/Electric-Box-Seal.html (Nov. 23, 2015); 3 pages.

*Primary Examiner* — Dhiru R Patel
(74) *Attorney, Agent, or Firm* — Fox Rothschild LLP; Robert J. Sacco; Carol E. Thorstad-Forsyth (57) ABSTRACT

An electrical box cover for an electrical outlet box includes a back and four sides extending from the back. The back and the four sides define an interior of the box cover that is large enough to cover the exterior of the electrical outlet box. The box cover is made of a soft, flexible material that can be molded to a shape of the electrical outlet box and that has certain elastomeric qualities so that the box cover can be slipped on to the electrical outlet box and installed, thereby providing additional sound and fire protection to the electrical outlet box. The cover box may also include a flange surrounding the opening in the box cover to cover any gaps around the cutout of the wall. The box cover may include one or more knock-outs that correspond to one or more knock-outs in the electrical outlet box.

3 Claims, 6 Drawing Sheets (51) Int. Cl.
*H02G 3/04* (2006.01)
*H02G 3/12* (2006.01)

(56) References Cited

U.S. PATENT DOCUMENTS

| | | | | |
|---|---|---|---|---|
| 4,063,110 A * | 12/1977 | Glick | ............ | H01R 13/6397 174/67 |
| 4,158,420 A * | 6/1979 | Balkwill | ............ | H02G 3/088 220/3.3 |
| 4,296,870 A | 10/1981 | Balkwill et al. | | |
| 4,408,695 A * | 10/1983 | Balkwill | ............ | H02G 3/088 174/57 |
| 4,626,617 A | 12/1986 | Rye | | |
| 4,667,840 A | 5/1987 | Lindsey | | |
| 4,724,281 A * | 2/1988 | Nix | ............ | H02G 3/123 174/53 |
| 5,189,259 A * | 2/1993 | Carson | ............ | H01H 9/02 174/57 |
| 5,663,525 A * | 9/1997 | Newman | ............ | H02B 1/305 174/50 |
| 6,066,803 A * | 5/2000 | Hagarty | ............ | H02G 3/081 174/50 |
| 6,521,834 B1 * | 2/2003 | Dykhoff | ............ | C09K 21/00 174/66 |
| 6,906,260 B2 | 6/2005 | Grendahl | | |
| 6,908,003 B2 | 6/2005 | Feyes et al. | | |
| 8,809,698 B2 * | 8/2014 | Clark | ............ | H02B 1/48 174/520 |
| 2009/0261091 A1 | 10/2009 | Dobson | | |

\* cited by examiner

MOLDED BOX COVER FOR FIRE AND ACOUSTICAL SEALING OF ELECTRICAL BOXES

CROSS-REFERENCE TO RELATED APPLICATIONS

This patent application claims priority to U.S. Provisional Patent Application No. 62/339,209 filed May 20, 2016, the disclosure of which is incorporated herein by reference in full.

FIELD OF THE INVENTION

This disclosure relates to the field of electrical box covers and particularly electrical box covers for fire and acoustical sealing.

DESCRIPTION OF THE PRIOR ART

Electrical boxes without protection can be installed in fire-rated walls provided that they meet certain criteria defined in the building codes, such as 2015 IBC (International Building Code) by the International Code Council. For example, boxes shall be separated by a minimum horizontal distance of 24 inches. When boxes are closely spaced, the gaps around these boxes can create a path for heat that may cause the fire to spread.

Other building codes may require that boxes not be located adjacent to combustibles such as behind a bed in a hotel or apartment or that the size of the box not be too large. For example, local codes may require that each individual box not exceed 16 square inches; and the aggregate cross-sectional area of boxes in a 100 square feet section wall may not exceed 100 square inches. Large boxes or greater density of boxes can introduce additional heat that may compromise fire integrity of the wall.

When building codes regarding electrical boxes are not met, firestop products may be used. These products are commonly referred to as "wall opening protective materials." Existing wall opening protective materials primarily include putty pads, box inserts or box cover gaskets. While these firestop products allow for reductions in horizontal separation, increases in individual box area and increases in the density of boxes in a given space, they have disadvantages. For example, putty pads are made of non-hardening, fire retardant putty, and can be shaped by hand onto surfaces of the box. However, they can be labor intensive to install.

Box inserts, such as those disclosed in U.S. Pat. No. 6,252,167 to Rose, are made from intumescent materials and are inserted into the back of the box. In the event of fire, the inserts expand to form an insulation. However, the box inserts are ineffective acoustically and provide no additional sealing functions. They often decrease the usable volume inside the box. Box gaskets are usually made from intumescent material that can expand and fill the box. They are installed beneath the electrical faceplate. Box gaskets, however, are typically required to be used with metal faceplates. Further, they can be inadvertently removed by the user when electrical faceplates are changed.

Other electrical box covers for other applications can be made of rigid or plastic materials that cover the entire electrical boxes. For example, Balkwill et al disclosed covers for electrical box in U.S. Pat. No. 4,296,870 and U.S. Pat. No. 4,408,695. These covers, however, usually require one or more fasteners, such as bolts to secure the cover to the box. As such, both the cover and the box need to be specially made to have one or more holes aligned that would allow one or more fasteners to lock the cover to the box. This not only requires specially made electrical boxes, but also increases the cost of making the covers. Other issues with existing firestop products include inadequate acoustic seals which allow sound to travel through unsealed gaps and voids. Further, sound flanking transmission can occur when the sound travels around the partition in a building. Today, having the capability of acoustic seal is often required of any firestop product. For example, acoustical ratings for walls in dwelling units are sometimes part of building codes. Acoustic sealing is sometimes also required in healthcare or privacy compliance, such as HIPPA compliance.

SUMMARY

An electrical box cover includes a back and four sides extending from the back, the four sides defining an opening positioned to go over a back of an electrical outlet box, and the back and the four sides defining an interior that is large enough to cover an exterior of the electrical outlet box. The box cover is made of a soft, flexible material that can be molded to the shape of the electrical outlet box and that has certain elastomeric qualities such that the box cover can be slipped on to the electrical outlet box easily and stay snugly fit, thereby providing additional sound and fire protection to the electrical outlet box.

Each of the four sides of the box cover may also include a flange surrounding the opening in the box cover and positioned to cover any gap between the electrical outlet box and the wall in which the electrical outlet box is installed in order to further reduce sound flanking transmission. Each of the four sides or the back of the box cover may include one or more knock-outs that correspond to one or more knock-outs in the electrical outlet box. The knock-outs in the box cover can be removed to allow a conduit or wire to pass through one of the knock-outs in the box cover and connect to the electrical outlet box.

DETAILED DESCRIPTION OF THE INVENTION

This disclosure is not limited to the particular systems, methodologies or protocols described, as these may vary. The terminology used in this description is for the purpose of describing particular versions or embodiments only, and is not intended to limit the scope.

Figure 1A:
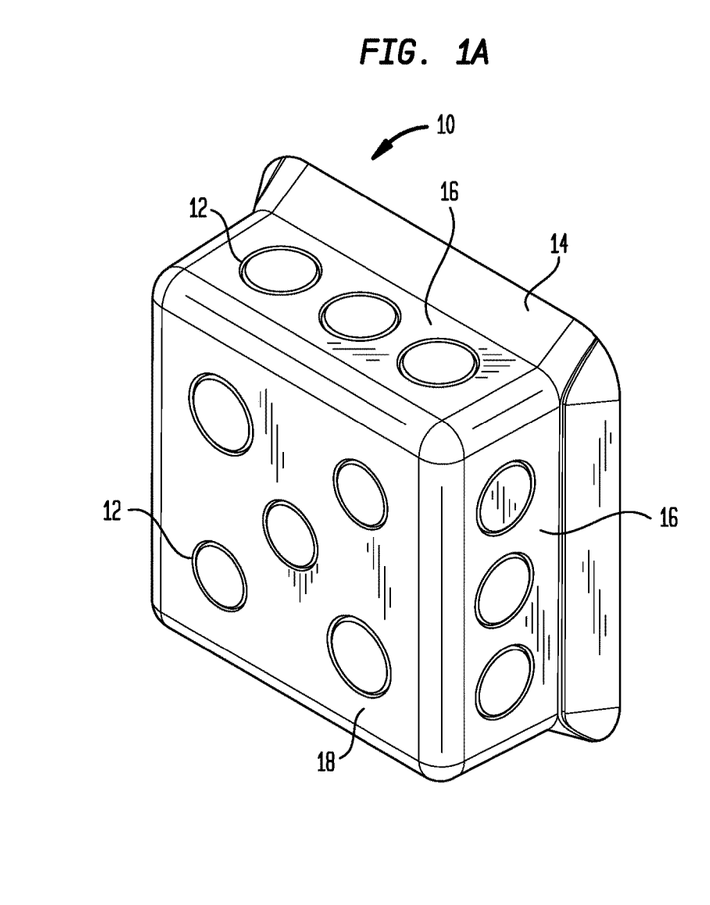
FIGS. 1A and 1B illustrate a back and front perspective view of an electrical box cover.
Figure 1B:
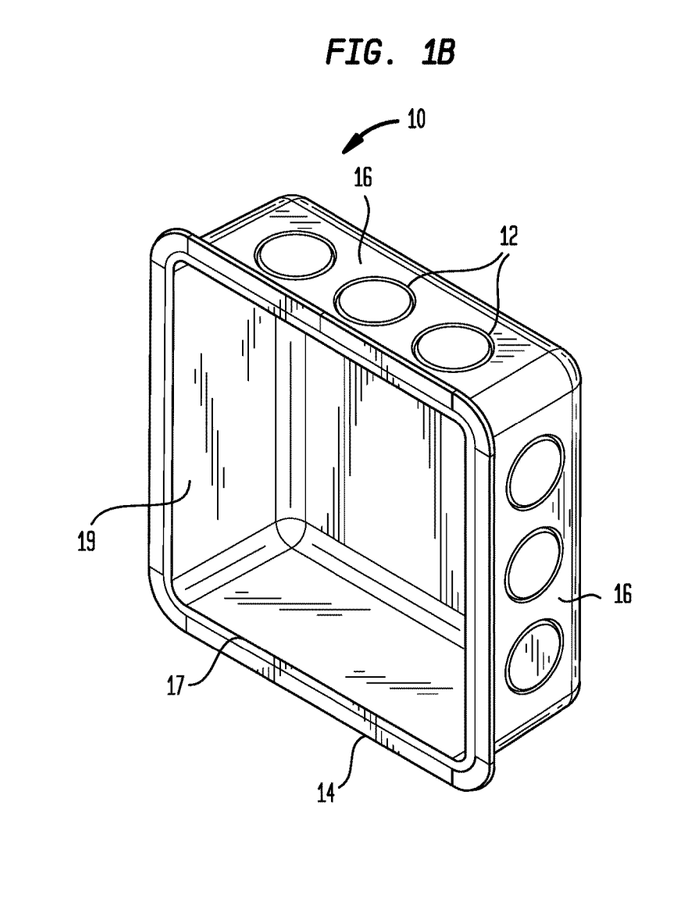
Figure 2A:
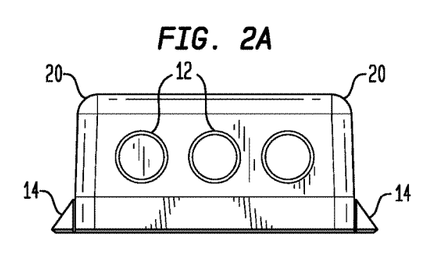
FIGS. 2A and 2C illustrate side views of the electrical box cover in FIGS. 1A and 1B.
Figure 2B:
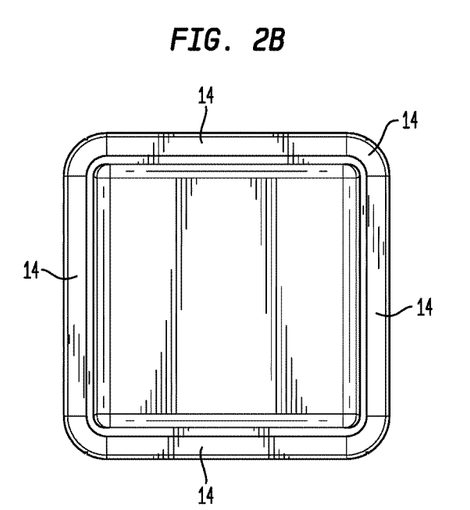
FIGS. 2B and 2D illustrate a front and back view of the electrical box cover in FIGS. 1A and 1B.
Figure 2C:
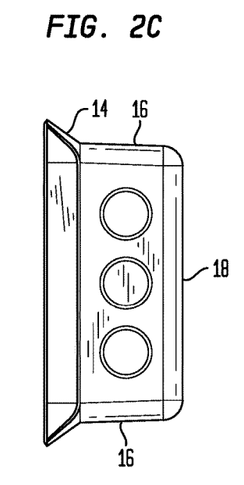
Figure 2D:
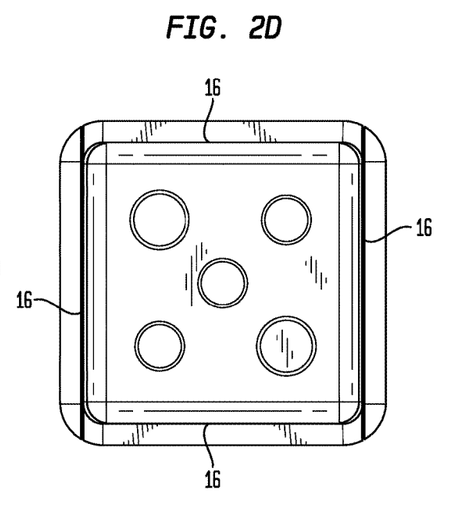

As shown in FIGS. 1A and 1B, an electrical box cover 10 includes a back 18 and four sides 16 extending from the back 18. The back 18 is defined by a first planar panel as shown. As may be observed in FIGS. 1A and 1B, the four sides 16 are each respectively comprised of a second planar panel and extend a distance transversely from the back 18. The back 18 and the four sides 16 are arranged as shown in FIGS. 1A and 1B to form a partially enclosed rectangular box structure having an open side opposed from the back. In this regard, the four sides 16 define an opening in the box 17. The opening may be positioned to go over the back of an electrical outlet box. The back 18 and the four sides 16 of the box define an interior 19 of the box cover that is large enough to cover an exterior of the electrical outlet box.

The box cover is made of a soft, flexible material. The box cover can be molded to the shape of the electrical outlet box so that the box cover can be easily slipped onto the electrical outlet box and installed at the job site or at the shop. This eliminates the labor associated with putty pads. Further, unlike a box insert that reduces the usable interior volume of the electrical box, the illustrated electrical box cover slips on the exterior of the electrical box and does not interfere with the interior of the electrical box (shown in FIG. 3).

The flexible material used in the box cover allows the box cover to provide better fire and sound insulation capabilities in comparison to existing wall opening protective materials. Further, as shown in FIGS. 2A-2D, each of the four sides may include a flange 14 surrounding the opening in the box cover 10 and positioned to cover any gap between the electrical outlet box and a wall in which the electrical outlet box is installed, thereby providing additional fire protection to the electrical outlet box. Additionally, sound flanking transmission is also mitigated due to the flange that tightly covers the gap and gaskets to backside of a gypsum board wall. Building codes usually allow up to ⅛ inch of a gap between an electrical box and a cutout in the wall so the flange can have a width about ⅛ inch to cover the gap.

Figure 3:
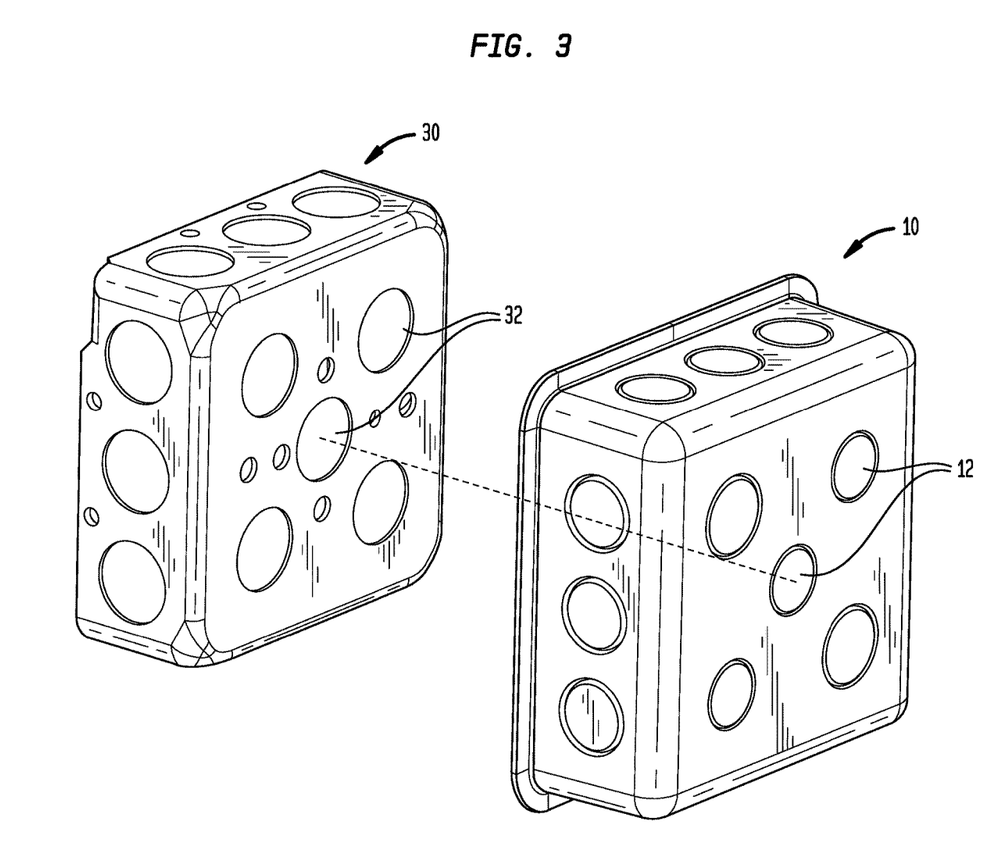
FIG. 3 illustrates the electrical box cover in FIGS. 1A and 1B that matches to an electrical box according to an example.

Additionally, as shown in FIG. 1A, at least one of the four sides 16 and the back 18 of the box cover 10 may include one or more knock-outs or punch-outs 12 that allows a wire connection to the electrical outlet box to go through. For example, as shown in FIG. 3, one, or more, knock-outs 12 in the back of the cover are aligned with one or more knock-outs 32 in the back of the electrical box 30. When the one, or more, knock-outs in the electrical outlet box cover are removed, they will allow a conduit or wire connector (e.g. BX or Romex) to pass through and connect to the electrical outlet box, thus making the electrical box cover stay tight against the electrical box to provide a good seal. In comparison to box inserts, the illustrated electrical box cover prevents fires from entering the wall cavity prematurely.

As above illustrated, the electrical box cover can be molded using a flexible or elastic compound. It can be molded into a variety of shapes and sizes to accommodate for a particular electrical box. For example, the electrical box cover can be molded for a conventional electrical box such as a 2"×4" electrical box, or a 4"×4" electrical box as shown in FIG. 3, or other sizes. As illustrated, such conventional electrical box 30 can have a rectangular box shaped exterior. Further, the box cover can be made of a formulation that has certain elastomeric qualities which allow the box cover to slip on the electrical box easily while staying fit against the exterior surface of the electrical box when installed. Once installed, the electrical box cover will not be easy to slip off the electrical box. This overcomes the issues with box gaskets, which can be easily, or inadvertently, removed by the user after being installed.

To achieve certain elastomeric quality, the cover box can be made of un-cured butyl material or thermoplastic in nature. In some scenarios, the cover box can be made of thermoplastic, a plastic material, or a polymer that is made up of linear molecular chains and that becomes pliable or moldable above a specific temperature and solidifies upon cooling. Thermoplastic polymers require no further chemical processing before molding. They can go through repeated heated and melting cycles. In other scenarios, the box cover can be made of thermoset polymers, which require a two-stage polymerization process. The first is done by the material supplier, which results in a linear chain polymer with partially reacted portions. The second is done by the molder, who controls final cross-linking. Short chains with many cross-links form rigid thermosets, while longer chains with fewer cross-links form more flexible thermosets. With all thermosets, the polymerization is permanent and irreversible.

In a preferred embodiment, the box cover can have a thermoset formulation that is built on long chains for its elastomeric properties. The balance of long chain chemistry for flexibility and other fire retardant additives provide the fire resistance performance along with adequate sealing. These elastomeric qualities allow the box cover to provide a snug fit around electrical boxes and thus provide good firestopping performance while minimizing the passage of smoke and transmission of sound by minimizing air leakage.

Further, once a knock-out is open and used to allow a wire connector to go through to connect to the electrical box, the wire connector will prevent the box cover from being inadvertently removed.

Figure 4A:
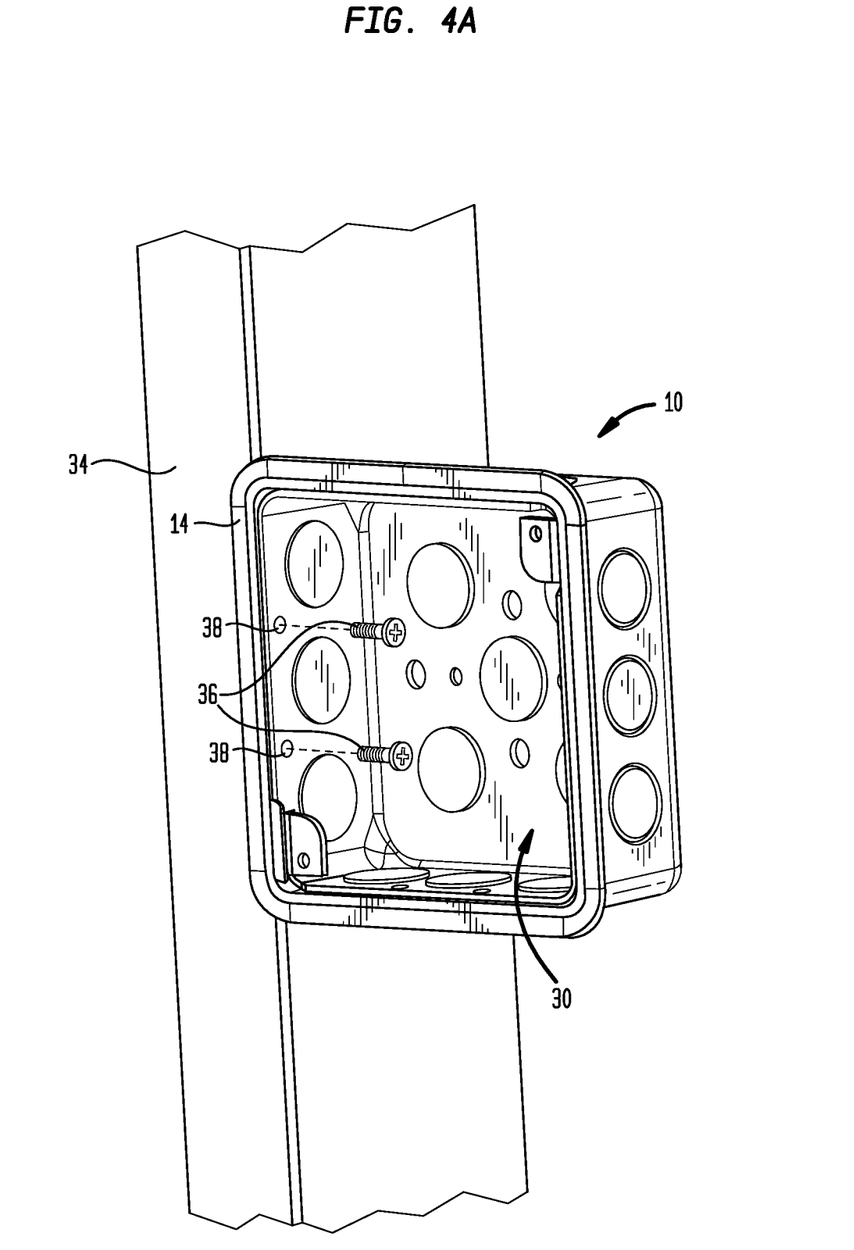
FIG. 4A illustrates a front perspective view of the electrical box cover in FIGS. 1A and 1B installed on a stud.
Figure 4B:
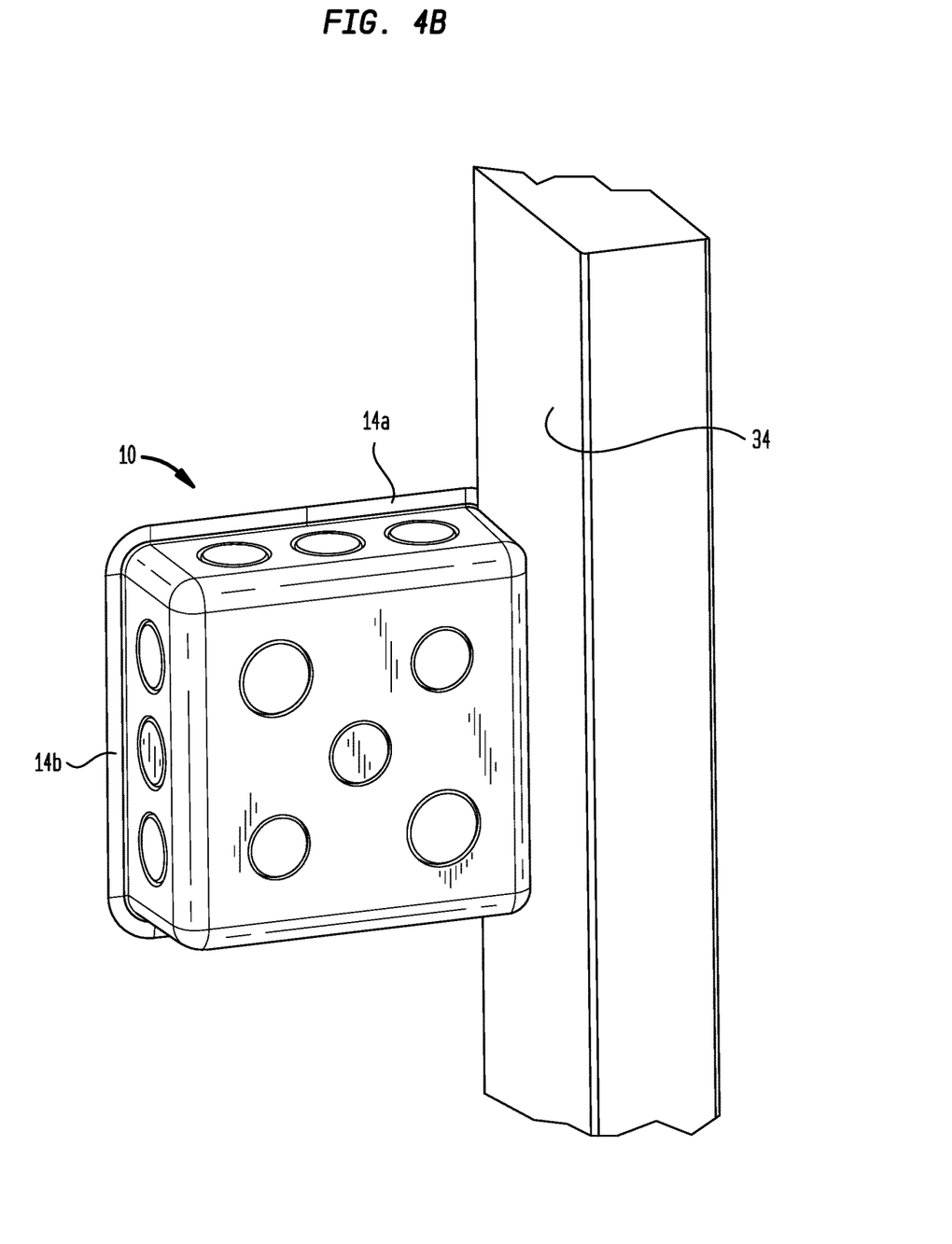
FIG. 4B illustrates a back perspective view of the electrical box cover in FIGS. 1A and 1B installed on a stud.
Figure 4C:
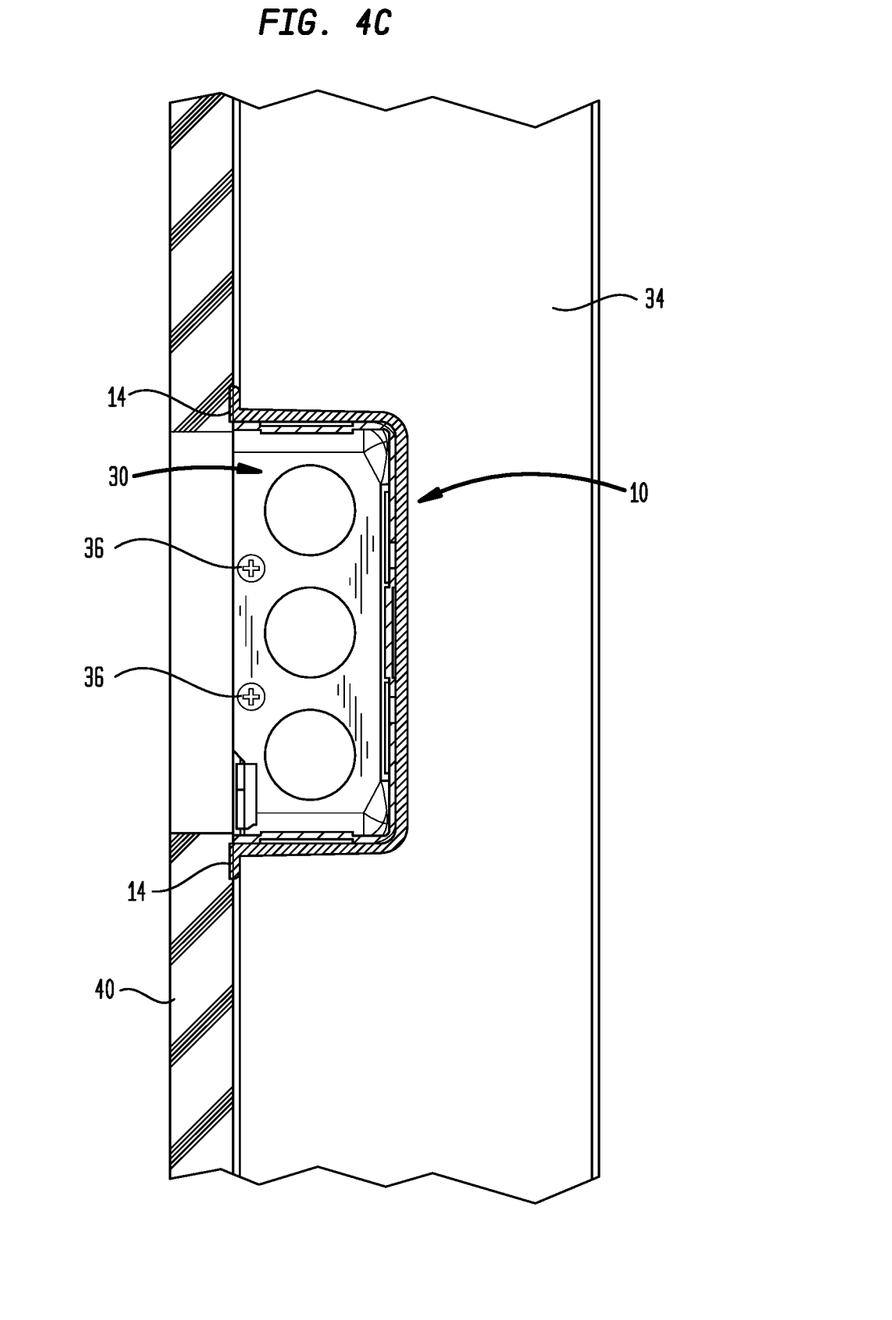
FIG. 4C illustrates a side perspective view of the electrical box cover in FIGS. 1A and 1B installed on a stud.

As shown in FIG. 3 and FIGS. 4A-4C, the electrical box cover 10 has an interior of a size and shape which is configured to fit closely around a rectangular box-shaped exterior of the electrical box 30. In this regard it may be observed in FIGS. 3 and 4A-4C that the first planar panel which defines the back 18 has a length and width which is coextensive with a length and width of the back of the electrical box 30. It may be further observed in FIGS. 4A and 4C that the four sides 16 of the electrical box cover, each respectively extend from the interior face of the back 18 a distance which is substantially equal to the distance extended by the four corresponding sides of the electrical box 30. The illustrated electrical box cover can be installed against various construction surfaces. For example, the electrical box cover 10 can be installed on an electrical box 30 against a stud 34 as shown in FIGS. 4A-4C. The box cover 10 can be slipped on the box 30 on a job site or at a shop before the electrical box 30 is installed to the stud 34. In some scenarios, the box 30 may have one or more holes 38 on a side that are positioned to receive one or more fasteners 36, such as screws, for fastening the box 30 to the stud 34. In other scenarios, the box cover 10 may also have one or more corresponding holes on a side (not shown) to match the holes 38 on the side of the box, or the box cover 10 is made of soft material such that a user can easily extend the fastener(s) 36 through the side of the cover box 10 without requiring a pre-drilled hole. Further, the box cover 10 may have a flange 14 (including 14a and 14b), which can be positioned against the wall 40, such as a gypsum board when installed, to cover any gap between the electrical box 30 and the cutout in the wall.

The above various illustrations are disclosed to show examples of an electrical box cover that is advantageous over existing wall opening protective materials. For example, the cover box is made of soft material and flexible materials to allow it to easily slip on to an electrical box for installation and stay on once installed. The materials of the cover box also allow the cover box to provide fire and sound sealing. Further, the flange of the cover box will provide additional fire and sound protection. The knock-outs on a side or back of the cover box will allow the connection of wire to the electrical box while making the box cover stay tight against the exterior surface of the electrical box to keep a tight seal.

Other advantages of the present invention can be apparent to those skilled in the art from the foregoing specification. Accordingly, it be recognized by those skilled in the art that changes or modifications may be made to the above-described embodiments without departing from the broad inventive concepts of the invention. It should therefore be understood that this invention is not limited to the particular examples and embodiments described herein, but is intended to include all changes, modifications, and all combinations of various embodiments that are within the scope and spirit of the invention as defined in the claims.

The invention claimed is:

1. A box cover apparatus to cover an existing electrical outlet box comprising:
    a back side and four sides panels extending from the back side to form a box-shaped cover having an exterior which is rectangular in form, and to cover the existing electrical outlet box:
    each of the back side and the four side panels of the box-shaped cover being made from of an elastomeric material, the back side of the box-shaped cover having a length and width coextensive with a length and width of a back side of the existing electrical box, and each of the four side panels of the box-shaped cover extending from an interior face of the back side of the box-shaped cover a distance equal to a distance extended by four sides panels of the existing electrical outlet box;
    the box-shaped cover having an open side opposed from the back side of the box-shaped cover to facilitate access to an interior of the box-shaped cover, the interior of the box-shaped cover having a rectangular size and shape to facilitate a snug fit around a rectangular box-shaped exterior of the existing electrical outlet box, provide a tight seal against the existing electrical outlet box, and retain the box-shaped cover on the rectangular box-shaped exterior of the existing electrical box; and
    wherein each of the four side panels of the box-shaped cover includes a flange formed of the elastomeric material and disposed along an edge of each of the four side panels opposed from the back side of the box-shaped cover, the flange extending in a direction transverse to each of the four sides panels, away from a peripheral edge of the box-shaped cover surrounding the open side of the box-shaped cover, whereby the flange is positioned to cover any gap between the existing electrical outlet box and an existing wall or stud in which the existing electrical box is installed, and to mitigate sound flanking transmission which can otherwise occur due to presence of the gap.

2. The box cover apparatus of claim 1, wherein at least one of the back side and the four side panels of the box-shaped cover comprise one or more knock-outs that are respectively aligned with one or more corresponding knock-outs in the existing electrical outlet box, the knock-outs removable to allow a conduit or wire to pass through one of the knock-outs in the box-shaped cover to form an electrical connection in the existing electrical outlet box.

3. The box cover apparatus of claim 2, wherein the box cover apparatus is made of a thermoset polymer.

* * * * *